United States Patent
Perroni et al.

(10) Patent No.: US 9,646,717 B2
(45) Date of Patent: May 9, 2017

(54) MEMORY DEVICE WITH INTERNAL MEASUREMENT OF FUNCTIONAL PARAMETERS

(75) Inventors: Maurizio Francesco Perroni, Furnari (IT); Giuseppe Castagna, Palermo (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 1120 days.

(21) Appl. No.: 13/361,578

(22) Filed: Jan. 30, 2012

(65) Prior Publication Data

US 2012/0197581 A1    Aug. 2, 2012

(30) Foreign Application Priority Data

Jan. 31, 2011 (IT) ............... MI2011A0120

(51) Int. Cl.
| | |
|---|---|
| *G11C 29/04* | (2006.01) |
| *G11C 29/12* | (2006.01) |
| *G06F 11/27* | (2006.01) |
| *G11C 29/50* | (2006.01) |
| *G11C 29/02* | (2006.01) |
| G11C 29/56 | (2006.01) |
| G06F 11/34 | (2006.01) |
| G11C 16/04 | (2006.01) |

(52) U.S. Cl.
CPC ............. *G11C 29/50* (2013.01); *G11C 29/02* (2013.01); *G11C 29/023* (2013.01); *G11C 29/50012* (2013.01); *G06F 11/3466* (2013.01); *G11C 16/04* (2013.01); *G11C 29/56012* (2013.01)

(58) Field of Classification Search
CPC .......... G06F 11/3466; G11C 29/50012; G11C 29/56012

USPC .......................................... 702/117, 118, 125
See application file for complete search history.

(56) References Cited

U.S. PATENT DOCUMENTS

| | | | | |
|---|---|---|---|---|
| 4,128,892 | A * | 12/1978 | Vasa | 702/79 |
| 6,108,252 | A * | 8/2000 | Park | G11C 29/50 |
| | | | | 365/189.07 |
| 2002/0176316 | A1* | 11/2002 | Benedix | G11C 7/1051 |
| | | | | 365/233.1 |
| 2004/0100840 | A1 | 5/2004 | Chang et al. | 365/201 |
| 2005/0211893 | A1* | 9/2005 | Paschalidis | 250/287 |
| 2005/0228562 | A1* | 10/2005 | Sayama et al. | 701/36 |
| 2008/0082871 | A1 | 4/2008 | Chung et al. | 714/719 |
| 2010/0061207 | A1* | 3/2010 | Trantham | G11B 27/36 |
| | | | | 369/53.1 |
| 2010/0109641 | A1 | 5/2010 | Noda et al. | 324/76.77 |

(Continued)

Primary Examiner — Mischita Henson
Assistant Examiner — Michael Dalbo
(74) Attorney, Agent, or Firm — Slater Matsil, LLP

(57) ABSTRACT

A non-volatile memory device may be integrated in a chip of semiconductor material. The memory device may include circuitry for receiving a measure instruction for obtaining a numerical measure value of a selected one among a plurality of predefined memory operations of the memory device. The memory device may also include circuitry for enabling the execution of the selected memory operation in response to the measure instruction. The execution of the selected memory operation may generate a corresponding result. The memory device may further include circuitry for providing at least one time signal, different from the corresponding result, relating to the execution of each memory operation, and circuitry for determining the measure value according to the at least one time signal of the selected memory operation.

17 Claims, 3 Drawing Sheets

(56) References Cited

U.S. PATENT DOCUMENTS

| | | | |
|---|---|---|---|
| 2010/0164476 A1* | 7/2010 | Molchanov et al. | 324/76.82 |
| 2011/0191526 A1* | 8/2011 | Haukness et al. | 711/103 |

* cited by examiner

MEMORY DEVICE WITH INTERNAL MEASUREMENT OF FUNCTIONAL PARAMETERS

FIELD OF THE INVENTION

The present invention relates to the field of electronics, and more specifically, to non-volatile memory devices.

BACKGROUND OF THE INVENTION

Non-volatile memory devices may be used in any application for storage of binary digits (or bits) of information that should be maintained even when the memory devices are not powered. An example of such devices are flash memory devices, each one of which typically includes a memory array, and peripheral circuits for functions of management and access thereto (such as, for example, decoder, reference voltage or band-gap generator, charge pumps).

At an appropriate phase of a production process of the memory device, the latter is generally subject to a parametric test to characterize the memory device, i.e. determine a measure value (or measure) of functional parameters thereof. The parametric test may represent a particularly burdensome aspect of the production process of the non-volatile memory devices, since it involves inefficiencies due to a reduced convenience and ease of measure where a relatively large number of functional parameters are to be measured.

For example, in a widely used approach, the parametric test is carried out through a technique known as electrical wafer sort (EWS). The parametric test implemented by the EWS technique is carried out on the memory devices yet included within a corresponding wafer of semiconductor material, and before the individual portions of the wafer on which the memory devices are integrated are diced into individual chips and embedded within respective packages.

The parametric test implemented by the EWS technique is executed on each memory device by automatic test equipment (ATE). The latter is provided with a test driver circuit (test driver) and a probe card including a plurality of conductive probes for contacting (operation called probing) corresponding conductive terminals (e.g., pads or pins) of the memory devices subject to the parametric test.

Typically, a test procedure (or routine) is run within the test driver to perform the parametric test. More particularly, such routine may include a memory instruction for the memory device, in response to which the latter performs a corresponding memory operation, and a sequence of test instructions, in response to which the test apparatus performs corresponding test operations for detecting a result of the memory operation and correspondingly determining the measure value of the functional parameter.

However, according to specific management protocols implemented within the memory device, each memory operation typically provides a result different in number and type (e.g., a voltage, a current, a string of bits, a synchronization signal, and the like). Thus, to characterize the memory device, it may be desirable, downstream from the memory operation, to process the result by specific auxiliary operative blocks (external and/or internal to the test apparatus) according to the functional parameter to be measured. Therefore, the test apparatus may be controlled by a specific routine for each functional parameter to be measured (for example, by configuring it to enable it to detect a determined type of result and/or a full reception of the same, or by setting it to allow the measurement of the functional parameter by exploiting the operative functional blocks within the test apparatus and/or external thereto).

For example, the characterization of the memory device by measuring functional parameters, such as band-gap time (time to generate the band-gap voltage), clock frequency of the charge pumps, and reading access time, may involve the implementation of corresponding routines different one to another. More specifically, to measure the band-gap time, the corresponding routine may provide the memory instruction to the memory device for performing the corresponding memory operation (band-gap voltage generation), and the test instruction to the test apparatus for monitoring an output terminal of the memory device (polling) until the complete reception of the result of the memory operation (band-gap voltage) and for enabling the measure of the band-gap time according to an elapsed polling time.

Instead, to measure the clock frequency of the charge pumps, the corresponding routine provides the memory instruction to the memory device for activating the charge pumps, and the test instruction to the test apparatus for enabling the test apparatus to receive the clock signal and provide the frequency value by exploiting proper circuits already present therein. Finally, to measure the reading time access, the corresponding routine provides the memory instruction to the memory device for performing a reading operation of a predefined memory address (typically provided together to the memory instruction), and the test instruction to the test apparatus for performing the polling to detect the result of the memory operation (read data) and controlling a detection block external to the test apparatus for enabling the measure of the access time (time interval between the sending of the predefined memory address and the arrival of the read data).

Therefore, the parametric test performed in this way provides for a continuous interaction with the test apparatus to set the latter according to the functional parameter to be measured. This makes the parametric test long and not efficient, and hence burdensome both in economic and practical terms for a manufacturer of the memory device.

SUMMARY OF THE INVENTION

The approach according to one or more embodiments of the present invention is based on the idea of implementing the measures within the memory device. In particular, one or more aspects of the approach according to specific embodiments of the invention are set out in the independent claims, with advantageous features of the same approach that are indicated in the dependent claims, (with any advantageous feature being provided with reference to a specific aspect of an embodiment of the invention that applies similarly to any other aspect thereof).

More specifically, an embodiment of the present invention may include a non-volatile memory device integrated in a chip of semiconductor material. The memory device includes means or circuitry fox receiving a measure instruction for obtaining a numerical measure value of a selected one among a plurality of predefined memory operations of the memory device (for example, a measure instruction of the band-gap time, of the clock frequency of the charge pumps or of the reading access time). Means or circuitry may also be provided for enabling the execution of the selected memory operation in response to the measure instruction. The execution of the selected memory operation may generate a corresponding result (for example, generating the band-gap voltage, activating the charge pumps, or reading a datum).

The memory device may further include means or circuitry for providing at least one time signal, different from the corresponding result, relating to the execution of each memory operation (for example, a start signal and a stop signal of the generation of the band-gap voltage and of the data reading, or a clock signal of the charge pumps). Means or circuitry may also be provided for determining the measure value according to the at least one time signal of the selected memory operation (for example, the duration of the band-gap time or the reading access time).

Another embodiment of the present invention may include a test apparatus for performing a parametric test on one or more of such memory devices. A further embodiment of the present invention may be directed to a corresponding method.

DETAILED DESCRIPTION OF THE PREFERRED EMBODIMENTS

The approach according to one or more embodiments, as well as further features and the advantages thereof, will be best understood with reference to the following detailed description, given purely by way of a non-restrictive indication, to be read in conjunction with the accompanying drawings, wherein corresponding elements are denoted with equal or similar references, and their explanation is not repeated for the sake of exposition brevity.

Figure 1:
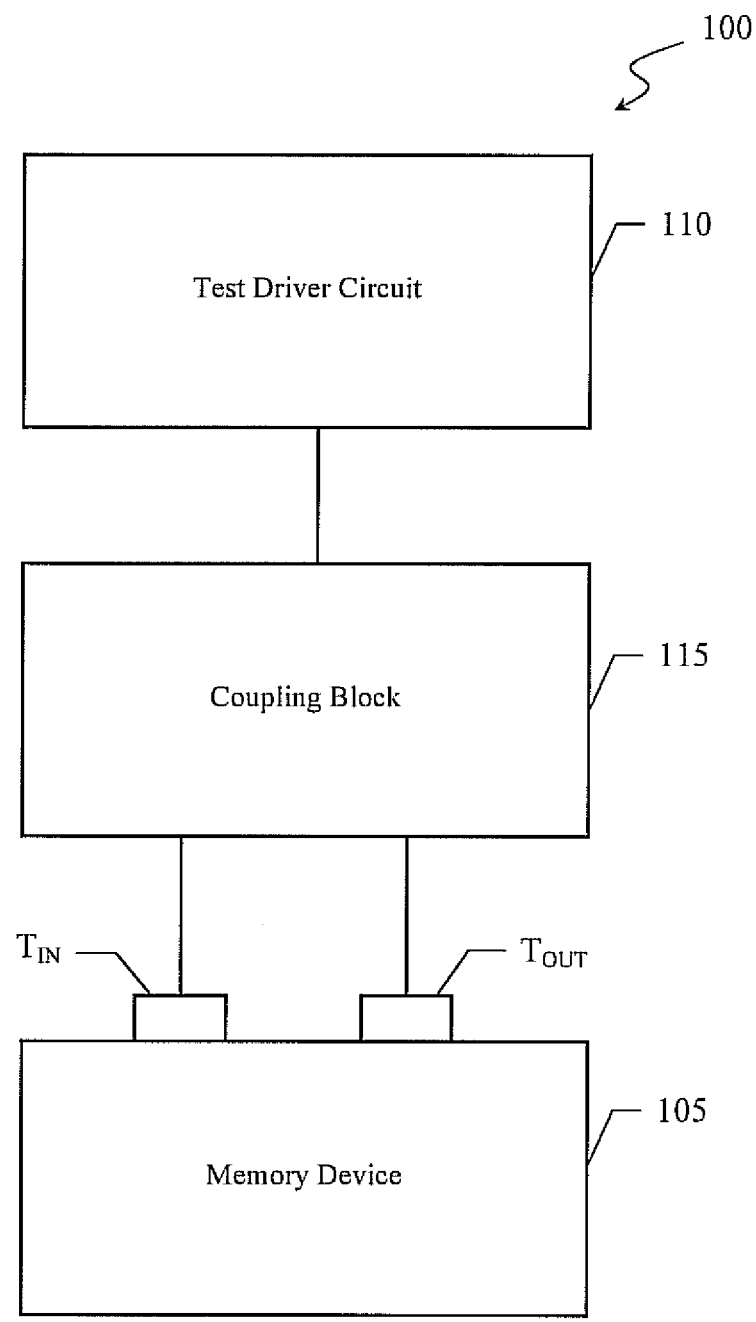
FIG. 1 is a schematic diagram of a test apparatus wherein an embodiment of the present invention may be applied.

With particular reference to FIG. 1, a test apparatus 100 is schematically illustrated wherein an embodiment may be applied. The test apparatus 100 may perform a parametric test on a plurality of non-volatile memory devices 105 (or simply memory devices, only one shown in the figure), to obtain a characterization thereof, i.e. to determine a measure value (or measure) of specific functional parameters. More particularly, the parametric test may be used for measuring a plurality of time functional parameters (e.g., band-gap time, reading access time, and clock frequency of charge pumps), each one associated (or associatable) with a corresponding predefined memory operation of the memory device 105 (e.g., generation of a band-gap voltage, reading of a memory address, and charge pumps activation, respectively).

The test apparatus 100 includes a test driver circuit (test driver) 110 for providing and receiving information in the form of electrical signals. In particular, the test apparatus 100 provides a measure instruction for obtaining a measure value of a corresponding memory operation within the memory device 105. To this end, the test driver 110 is coupled with input terminals $T_{IN}$, only one shown for simplicity, and output terminals $T_{OUT}$, only one shown for simplicity, of each memory device 105 through a coupling block 115 (e.g., a probe card, not shown in the figure, including a printed circuit board and a plurality of electrically conductive probes, such as for the EWS testing).

The measure instruction is typically encoded by a string of binary digits (or bits) according to a known communication protocol. The corresponding result is represented by a numeric value encoded by another string of bits.

Figure 2:
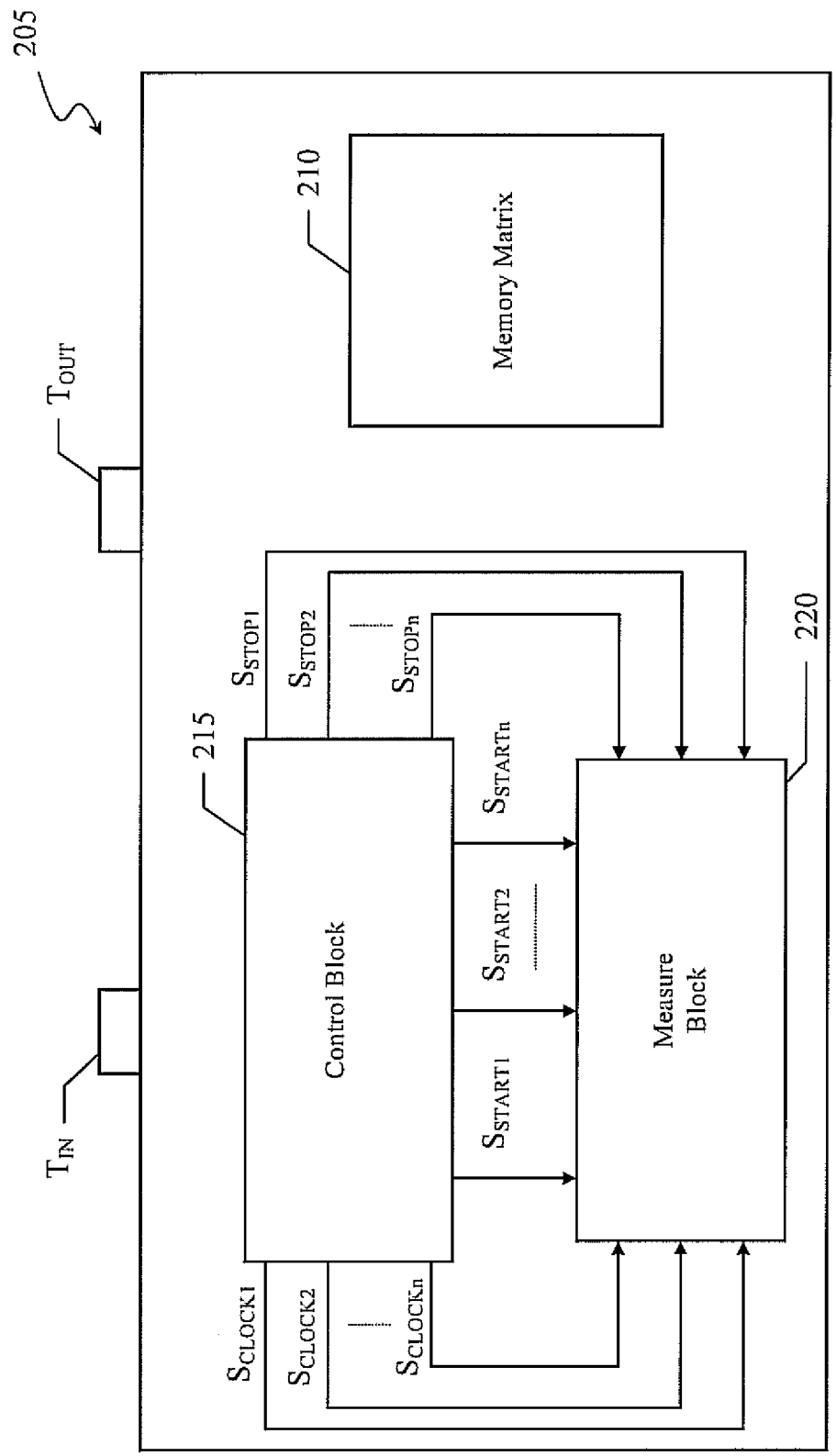
FIG. 2 is a schematic diagram of a non-volatile memory device according to an embodiment of the present invention.

Turning now to FIG. 2, a memory device 205 (e.g., a non-volatile memory device, such as a flash memory device) according to an embodiment is schematically illustrated. In the following, for the sake of exposition, brevity, and clarity, only functional blocks (relevant to the embodiment) directly or indirectly involved in the measure of significant functional parameters of the memory device 205 are introduced and described.

The memory device 205 includes, in addition to the terminal $T_{IN}$ for receiving the measure instruction and to the terminal $T_{OUT}$ for providing the measure value, a memory matrix 210 for storage purposes, and a plurality of peripheral circuits (not shown) for management and access thereto. The memory device 205 also includes a control block 215, which, by interfacing with the memory matrix 210 (connection not shown) and the peripheral circuits, generally controls functions of the memory device 205. For example, the control block 215 is able, in a known manner, to provide a plurality of time signals. The time signals may be logically divided into groups (of one or more time signals), each one of which is indicative of the execution of a corresponding selected memory operation (i.e., performed by the memory device 205 according to the measure instruction received at the terminal $T_{IN}$). Such time signals may include both status signals relating to a status of the execution of the selected memory operation, and synchronization signals (or clock signals) $S_{CLOCKi}$ (with i=1, 2 . . . n).

More particularly, the status signals may include a set of start signals $S_{STARTi}$ (with i=1, 2 . . . n), each one indicative of a start of the execution of a corresponding selected memory operation, and a plurality of stop signals $S_{STOPi}$ (with i=1, 2 . . . n), each one indicative of a stop of the execution of a corresponding selected memory operation. Therefore, for each selected memory operation, the control block 215 may provide a pair of signals $S_{STARTi}$, $S_{STOPi}$ relating to the status of the execution of the selected memory operation and/or the signal $S_{CLOCKi}$ relating to the synchronization of one or more of the peripheral circuits involved therein.

The memory device 205 may further include a measure block 220 for receiving the signals $S_{STARTi}$, $S_{STOPi}$, $S_{CLOCKi}$ and determining the measure of the time parameter according to one or more of such signals $S_{STARTi}$, $S_{STOPi}$, $S_{CLOCKi}$. Therefore, advantageously, the memory device 205 may provide the terminal $T_{OUT}$ (and thus directly the test apparatus) with a numerical measure value of the functional parameter, and not the result of the corresponding selected memory operation (that would involve additional processing for obtaining the measure value from it).

Figure 3:
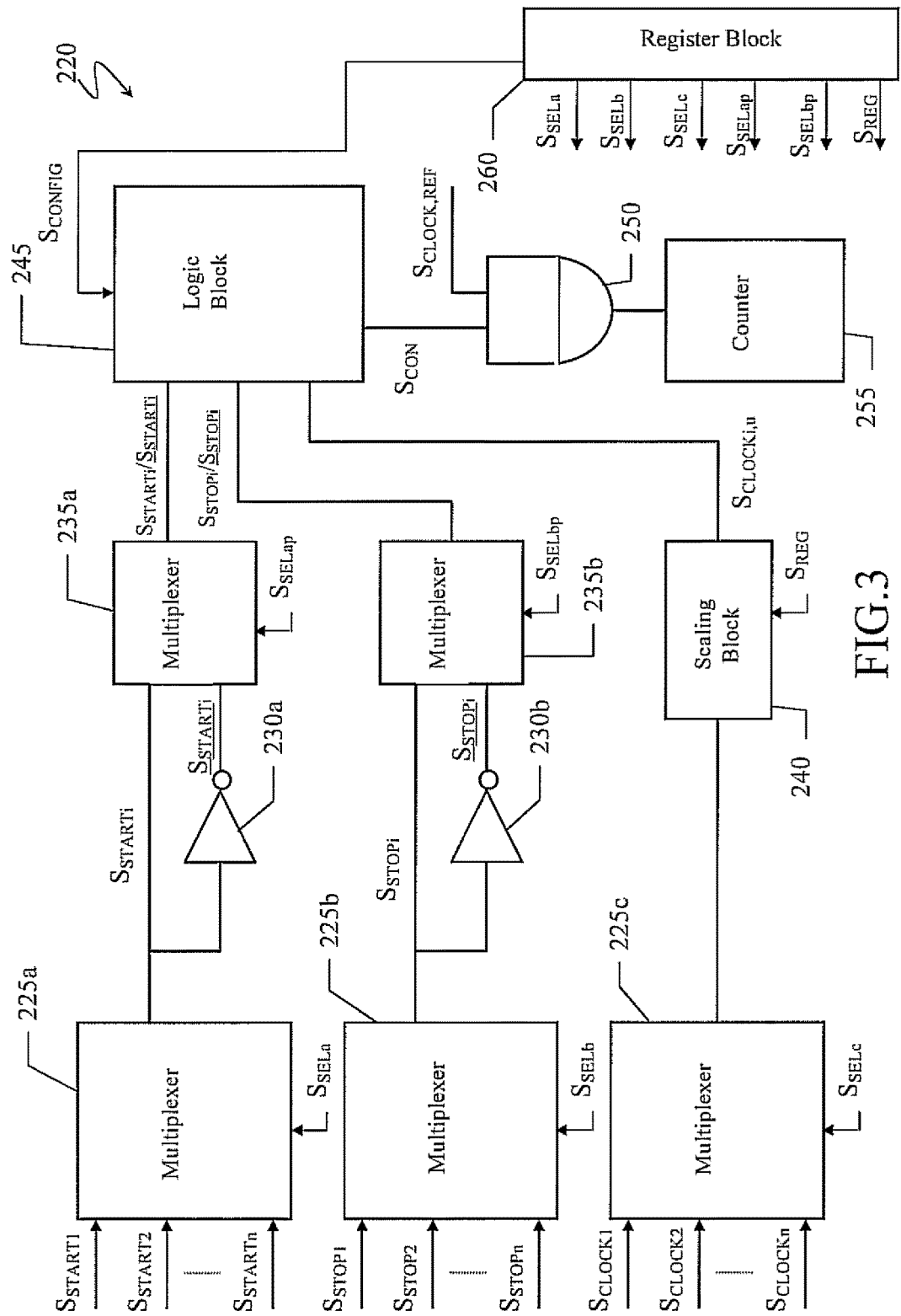
FIG. 3 is a schematic diagram of a circuit of a measure block of a memory device according to an embodiment of the present invention.

Referring now to FIG. 3, a circuit implementation of the measure block 220 according to an embodiment is illustrated. The measure block 220 includes three multiplexers 225a, 225b and 225c, each one having n input terminals, an output terminal, and a selection terminal. In particular, the multiplexer 225a, 225b, 225c receives the signals $S_{STARTi}$, $S_{STOPi}$, $S_{CLOCKi}$, respectively, at its input terminals and provides a selected one of such signals to its output terminal according to a corresponding selection signal $S_{SELa}$, $S_{SELb}$, $S_{SELc}$ received at the selection terminal.

The measure block 220 further includes a logic inverter 230a (for example, in CMOS logic) and another logic inverter 230b similar to the logic inverter 230a. The logic inverter 230a, 230b is connected to the output terminal of the multiplexer 225a, 225b for receiving the selected signal $S_{STARTi}$, $S_{STOPi}$ and providing a corresponding signal $\overline{S_{STARTi}}$, $\overline{S_{STOPi}}$ negated with respect to the selected signal $S_{STARTi}$, $S_{STOPi}$.

The measure block 220 includes two further multiplexers 235a and 235b each one having two input terminals, an output terminal, and a selection terminal. In particular, an input terminal of the multiplexer 235a, 235b is connected to the output terminal of the multiplexer 225a, 225b, whereas the other input terminal of the multiplexer 235a, 235b is connected to the output terminal of the logic inverter 230a, 230b. In this way, the multiplexers 235a and 235b receive the signals $S_{STARTi}$, $\overline{S_{STARTi}}$, and the signals $S_{STOPi}$, $\overline{S_{STOPi}}$ at the respective input terminals, and provide a selected one of such signals (which hereinafter will be referred to as a functional start signal denoted by the reference $S_{STARTi}$/$\overline{S_{STARTi}}$, and a functional stop signal denoted by the reference $S_{STOPi}$/$\overline{S_{STOPi}}$, respectively) to the respective output terminal according to a selection signal $S_{SELap}$, $S_{SELbp}$ received at the corresponding selection terminal. As will be explained more in detail in the following, the signal $S_{SELap}$, $S_{SELbp}$ depends on a polarity with which the selected signal $S_{STARTi}$, $S_{STOPi}$ has been implemented within the memory device.

The measure block 220 further includes a scaling block 240 having an input terminal for receiving the selected signal $S_{CLOCKi}$, at a corresponding frequency (representing the functional parameter to be measured), and an output terminal for providing a functional synchronization signal $S_{CLOCKi,u}$ at another frequency scaled with respect to the frequency of the selected signal $S_{CLOCKi}$ by a suitable scaling factor. As will be explained in the following, the scaling factor is such that the frequency of the signal $S_{CLOCKi,u}$ is compatible with a following counting operation. More specifically, such scaling factor depends on a ratio between a reference frequency of a reference synchronization signal $S_{CLOCK,REF}$ (for example, a periodic signal generated outside the memory device) and an assumed value of the frequency of the selected signal $S_{CLOCKi}$ (being known, since it may be theoretically close to the design value), which is adjustable within the scaling block 240 according to an appropriate regulation signal $S_{REG}$.

The measure block 220 further includes a logic block 245 including three input terminals connected to the output terminal of the multiplexer 235a, the output terminal of the multiplexer 235b and the output terminal of the scaling block 240, respectively. The logic block 245 also includes a configuration terminal for receiving a configuration signal $S_{CONFIG}$, and an output terminal for providing a counting signal $S_{CON}$ according to the signals $S_{STARTi}$/$\overline{S_{STARTi}}$, $S_{STOPi}$/$\overline{S_{STOPi}}$, $S_{CLOCKi,u}$ and $S_{CONFIG}$.

The measure block 220 also includes an AND logic gate 250 (for example, in CMOS logic as well) having two input terminals and an output terminal, and a counter 255 of a known type connected to the output terminal of the AND logic gate 250 and coupled with the output terminal of the memory device (not shown) for providing the latter with the measure value of the time parameter. In particular, the AND logic gate 250 receives the signal $S_{CON}$ at an input terminal thereof and the signal $S_{CLOCK,REF}$ (used by the counter for counting) at the other input terminal. Finally, the measure block 220 includes a register block 260 for providing the signals $S_{SEL}$, $S_{SELb}$, $S_{SELc}$, $S_{SELap}$, $S_{SELbp}$, $S_{REG}$, $S_{CONFIG}$ (electrical connections are not shown for the sake of simplicity) according to the selected memory operation.

The operating principle of the measure block 220 may be summarized as follows. As the memory device receives the measure instruction, the block 220 determines one between two possible configurations of the logic block 245 (according to the selected memory operation and according to a corresponding type of time functional parameter to be measured), i.e., a first configuration wherein the logic block 245 allows determining a duration of the selected memory operation, and a second configuration wherein the logic block 245 allows determining the clock frequency of one of the peripheral circuits of the memory device involved in the selected memory operation. This is performed by the register block 260, which, in response to the selected memory operation, asserts or de-asserts the signal $S_{CONFIG}$ for setting the (common) logic block 245 in the first configuration or in the second configuration, respectively, (or vice-versa without that, this, as will be understood, may alter the operating principle). In case the signal $S_{CONFIG}$ is asserted (first configuration), the register block 260 provides the signals $S_{SELa}$, $S_{SELb}$ to the multiplexers 225a, 225b for selecting the signals $S_{STARTi}$, $S_{STOPi}$ according to the memory operation defined within the measure instruction (e.g., band-gap voltage generation, reading of a predefined memory address, or the like).

Before the start of the execution of the selected operation, such signals $S_{STARTi}$, $S_{STOPi}$ are both de-asserted, but with a polarity that depends on how they have been implemented within the memory device (with the polarity information that is included within the register block 260). In general, the signals $S_{STARTi}$ may be asserted, all or in part, at the high or low logic level, as well as the signals $S_{STOPi}$ (with the signals $S_{STOPi}$ that may also have not the same polarity as the corresponding signals $S_{STARTi}$). For this reason, according to the selected memory operation, the register block 260 provides the signals $S_{SELap}$, $S_{SELbp}$ at the appropriate value to allow the multiplexers 235a and 235b to select the signal $S_{STARTi}$ or the signal $\overline{S_{STARTi}}$ and the signal $S_{STOPi}$ or the signal $\overline{S_{STOPi}}$, respectively, according to a polarity of the logic block 245. For example, since the latter may be implemented according to any combinatorial and/or sequential logic circuit without the principles of the present embodiments becoming limited, where the logic block 245 is implemented by using active high latches (not shown), the signals $S_{SELap}$, $S_{SELbp}$ may be such as to select one between the signal $S_{STARTi}$ and the signal $\overline{S_{STARTi}}$, and one between the signal $S_{STOPi}$ and the signal $\overline{S_{STOPi}}$ that, at the start and stop of the selected memory operation, respectively, is asserted at the high logic level (and vice-versa in case of, for example, active low latches).

At this point, at the assertion of the signal $S_{STARTi}$/$\overline{S_{STARTi}}$, the logic block 245 asserts the counting signal (for example, to the high logic level), so that the signal $S_{CLOCK,REF}$ is received by the counter 255. The latter, in a known manner, performs a counting of the number of cycles of the signal $S_{CLOCK,REF}$ within a counting interval. Such counting interval may be defined as the time interval between the assertion of the signal $S_{STARTi}$/$\overline{S_{STARTi}}$ and the assertion of the signal $S_{STOPi}$/$\overline{S_{STOPi}}$ (in other words, the logic block 245 latches the asserted signal $S_{CON}$ until the end of the selected memory operation). In fact, when the signal $S_{STOPi}$/$\overline{S_{STOPi}}$ has been asserted, thereby indicating that the selected memory operation has ended, the logic block 245 de-asserts the signal $S_{CON}$ (for example, to the low logic level). This also may force the output of the AND logic gate 250 down to the low logic level, thus causing the interruption of the counting by the counter 255.

At this point, the counter 255, whose counting is the measure value of the functional parameter, may send such measure value to the output terminal of the memory device, or process and/or store it for providing it later (e.g., at the end of the parametric test, possibly together with other measure values of the same or other memory operations).

When the signal $S_{CONFIG}$ is de-asserted (second configuration), the register block 260 provides the signal $S_{SELc}$ to the multiplexer 225c for selecting the signal $S_{CLOCKi}$ according to the selected memory operation (for example, activation of the charge pumps), and the signal $S_{REG}$ to the multiplexer 235a for providing the signal $S_{CLOCKi,u}$ to the logic block 245 according to the scaling factor. In such second configuration, the logic block 245 may be sensitive to an edge of the received signal rather than a level thereof (such as in the first configuration). In particular, the logic block 245 asserts the signal $S_{CON}$ in response to a switching (for example, a rise edge) of the signal $S_{CLOCKi,u}$ (with such switching that, unless a possible phase shift introduced by the scaling block 240, corresponds to the switching of the selected signal $S_{CLOCKi}$). This involves the start of the counting (by the counter 255) of the number of cycles of the signal $S_{CLOCK,REF}$ in a counting interval defined by a period of the signal $S_{CLOCKi,u}$ (time distance between two identical successive switchings, i.e. two rising edges in the example at issue). In this case, the counting provides the value of the period of the signal $S_{CLOCKi,u}$, from which it may be possible to obtain the frequency thereof and hence the frequency of the signal $S_{CLOCKi}$ (e.g., by a suitable algebraic block, not shown, that computes the inverse of the period of the signal $S_{CLOCKi,u}$, and performs an operation opposite to that of the scaling block 240).

It should be noted that the scaling factor may be such that the frequency of the signal $S_{CLOCK,REF}$ is sufficiently greater than the frequency of the signal $S_{CLOCKi,u}$ to ensure that the period of the signal $S_{CLOCKi,u}$ includes a relatively high number (e.g., preferably from 10 to 100, still more preferably from 40 to 70, such as 55) of periods of the signal $S_{CLOCK,REF}$ (and to allow a more accurate counting of the period of the signal $S_{CLOCKi,u}$ and hence of the frequency thereof).

The described approach is particularly advantageous as it calculates the measured value of a plurality of functional parameters by using a single measure block within the memory device. This allows that, during the parametric test, the apparatus may not need either complex test instructions (as the measured numeric value, being able to be provided directly to the test apparatus from the memory device, needs no further processing) or dedicated routines for each measure parameter. Therefore, the described memory device allows performing parametric tests that, as not providing for continuous interactions with the test apparatus, have shorter durations and are more efficient, with advantages in both economic and practical terms.

Naturally, to satisfy local and specific requirements, a person skilled in the art may apply to the approach described above many logical and/or physical modifications and alterations. More specifically, although the present embodiments have been described with a certain degree of particularity, it should be understood that various omissions, substitutions and changes in the form and details as well as other embodiments are possible. In particular, different embodiments may even be practiced without the specific details (such as the numeric examples) set forth in the preceding description for providing a more thorough understanding thereof. On the contrary, well known features may have been omitted or simplified to not obscure the description with unnecessary particulars. Moreover, specific elements and/or method steps described in connection with any disclosed embodiment of the invention may be incorporated in any other embodiment as a matter of general design choice.

For example, analogous considerations may apply if the memory device has a different structure or includes equivalent components. In any case, any component thereof may be separated into several elements, or two or more components may be combined into a single element. Moreover, each component may be replicated for supporting the execution of the corresponding operations in parallel. It should also be noted that any interaction between different components generally does not need to be continuous (unless otherwise indicated), and it may be both direct and indirect through one or more intermediaries. For example, the memory device may be provided with more than one control block. Each peripheral circuit of the memory device may be provided with its own control block for monitoring the status during the execution of the selected memory operation and providing the corresponding start, stop and synchronization signals.

Moreover, although in the present description only two conductive terminals for exchanging electrical signals during the execution of the parametric test have been described and shown, the memory device may include several conductive terminals suitable for the purpose. For example, it may be possible to provide the use of an output terminal for providing the result of the operation, and further output terminals for providing the measure value and/or the start, stop and synchronization signals (for example, for using such signals in appropriate control algorithms for obtaining more precise measure values of the functional parameters). In addition, the memory device may store, in appropriate locations of the memory matrix or in properly configured registers, the measure values of a predefined number of functional parameters, and provide them (for example, serially through the output terminal) at the end (or at any phase) of the parametric test.

The memory device may be of the FLASH, EPROM, or E$^2$PROM type. The multiplexers may be implemented according to any technology deemed appropriate and/or by using conceptually equivalent techniques (or they may also be omitted in the case of individual time signals).

The counter may be implemented in any useful manner, such as by flip-flops, and provide counting in binary, decimal, hexadecimal code, at 4 bits or 8 bits. The counter may also be provided with pins (for example, for zeroing it or selecting the type of code for the counting), accessible from outside of the memory device, or through the measure instruction.

In addition, the logic inverters may not be present, for example, where the control block of the memory device already provides the negated start signal and the negated stop signal, or be present in greater numbers. In the latter case, one or more inverter chains may be provided for reconstructing edges and levels of the start signals and of the stop signals, to avoid degradation thereof. The logic block may be made in combinatory or sequential logic, or a combination thereof.

The reference synchronization signal is not limiting for the present embodiments, and it may be any periodic signal (e.g., sine or square wave). Analogously, even the clock signals whose frequency it may be desirable to calculate (functional parameter) may be of a different type, or have reciprocally different swings. In the latter case, it may be possible to provide the use of circuits for making the swing of each synchronization signal uniform to the swing of the logic circuits (such as, for example, the one of the AND logic gate).

The measure block may also include a control element that allows updating, after the measure of each clock frequency, the values with respect to the assumed values (i.e., the design values) within the register block. In any case, the band-gap time, the reading access time, and the clock frequency represent respective merely illustrative measure types, and therefore they should not be constructed in a limiting way. In this respect, the described approach may also be applied to other similar measures (e.g., programming time, erasing time, rise and/or falling time of input signals, time of data transfer to registers from the memory matrix, and the like), or for further measure types. In the latter case, it should be noted that the logic block may be implemented to provide additional configurations for allowing such further measure types (with the configuration signal that may be a binary code with an appropriate number of bits).

Moreover, separate logical blocks may be provided for the different measure types (instead of a common one configurable in different way). Similar considerations apply if the test apparatus has a different structure or includes equivalent components (both separated to each other and combined together, in whole or in part).

It should be readily understood that the proposed structure may be part of the design of an integrated circuit. The design may also be created in a programming language. Moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor). In any case, the integrated circuit is suitable to be used in complex systems (such as automotive applications).

Finally, the embodiments may be implemented through an equivalent method (by using similar steps, removing some steps being not essential, or adding further optional steps). Moreover, the steps may be performed in different order, concurrently or in an interleaved way (at least partly).

That which is claimed:

1. A non-volatile memory device integrated in a semiconductor chip, the non-volatile memory device comprising:
   at least one input terminal configured to receive a plurality of measure instructions for obtaining a plurality of numerical measure values for time functional parameters, each corresponding to one of a plurality of memory operations;
   processing circuitry configured to enable execution of a given one of the plurality of memory operations in response to a corresponding one of the plurality of measure instructions, the execution of the given memory operation generating a corresponding result;
   a memory integrated in the semiconductor chip;
   control circuitry integrated in the semiconductor chip and configured to cooperate with said memory to provide at least one time signal, different from the corresponding result, relating to the execution of each memory operation;
   measuring circuitry integrated in the semiconductor chip and configured to determine the corresponding numerical measure value for a given time functional parameter based upon the at least one time signal of the selected memory operation, the at least one time signal comprising a start signal to be asserted based upon starting of the execution of the given memory operation, a stop signal to be asserted based upon a stop of the execution of the memory operation, and a synchronization signal, said measuring circuitry comprising
   first selection circuitry configured to select the start signal,
   further first selection circuitry configured to select the stop signal,
   time measurement circuitry configured to measure a time difference between the assertion of the selected start signal and the assertion of the selected stop signal, the corresponding numerical measure value for the given time functional parameter based upon the time difference,
   second selection circuitry configured to select the synchronization signal, and
   period measuring circuitry configured to measure a period of the selected synchronization signal, the corresponding numerical measure value for the given time functional parameter being based upon the period; and
   at least one output terminal coupled to said measuring circuitry and configured to provide the corresponding numerical measure value without providing the corresponding result generated from the given memory operation.

2. The non-volatile memory device according to claim 1, wherein said time measurement circuitry comprises:
   logic circuitry configured to provide a first counting signal to be asserted during a counting interval from the assertion of the selected start signal to the assertion of the selected stop signal; and
   first counting circuitry configured to receive the first counting signal and a first reference synchronization signal, and determine the time difference by counting a number of cycles of the first reference synchronization signal within the first counting interval.

3. The non-volatile memory device according to claim 2, wherein said logic circuitry comprises:
   a first logic inverter configured to receive the selected start signal and provide a corresponding negated selected start signal; and
   a second logic inverter configured to receive the selected stop signal and provide a corresponding negated selected stop signal;
   other first selection circuitry configured to receive the selected start signal and the negated selected start signal and provide a functional start signal corresponding to a selected one between the selected start signal and the negated selected start signal according to the polarity of the selected start signal; and
   further other first selection circuitry configured to receive the selected stop signal and the negated selected stop signal and provide a functional stop signal corresponding to a selected one between the selected stop signal and the negated selected stop signal according to the polarity of the selected stop signal; and
   first logic circuitry configured to receive the functional start signal and the functional stop signal and provide the counting signal according to the functional start signal and the functional stop signal.

4. The non-volatile memory device according to claim 1, wherein said period measuring circuitry comprises:
   second logic circuitry configured to provide a second counting signal, the second counting signal being asserted during a second counting interval between two consecutive assertions of the selected synchronization signal; and further counting circuitry configured to receive the further counting signal and a second reference synchronization signal, and determine the period according to a counting of a number of cycles of the second reference synchronization signal within the second counting interval.

5. The non-volatile memory device according to claim 4, wherein said second logic circuitry comprises:
scaling circuitry configured to receive the selected synchronization signal at an original frequency and provide a functional synchronization signal at a frequency scaled with respect to the original frequency by a scaling factor, the scaling factor being based upon a ratio between a frequency of the reference synchronization signal and an assumed value of the original frequency; and
generating circuitry configured to generate the second counting signal based upon the functional synchronizing signal.

6. The non-volatile memory device according to claim 5, wherein said first logic circuitry and said second logic circuitry comprise common logic circuitry configured to implement the first logic circuitry in a first configuration and the second logic circuitry in a second configuration, said measuring circuitry comprising registering circuitry configured to
configure the common logic circuitry in at least one of the first configuration and the second configuration based upon the measure instruction,
control the first selection circuitry and the further first selection circuitry in the first configuration and the second selection circuitry in the second configuration based upon the measure instruction,
provide a polarity signal indicative of the polarity of the selected start signal and of the selected stop signal based upon the measure instruction in the first configuration, and
control the other first selection circuitry and the further other first selection circuitry based upon the polarity signal in the first configuration, and
provide the scaling circuitry with a regulation signal indicative of the scaling factor in the second configuration.

7. The non-volatile memory device according to claim 1 wherein the time functional parameters comprise one of band-gap time and a frequency of charge pumps.

8. An integrated circuit comprising:
at least one input terminal configured to receive a plurality of numerical measure values for time functional parameters, each corresponding to one of a plurality of memory operations;
processing circuitry configured to enable execution of a given one of the plurality of memory operations and generate a corresponding result;
a memory;
control circuitry configured to cooperate with said memory to provide at least one time signal, different from the corresponding result, relating to the given memory operation;
measuring circuitry configured to determine the corresponding numerical measure value for a given time functional parameter based upon the at least one time signal, the at least one time signal comprising a start signal, a stop signal, and a synchronization signal, said measuring circuitry comprising
first selection circuitry configured to select the start signal,
further first selection circuitry configured to select the stop signal,
time measurement circuitry configured to measure a time difference between the start signal and the stop signal, the corresponding numerical measure value for the given time functional parameter being based upon the time difference,
second selection circuitry configured to select the synchronization signal, and
period measuring circuitry configured to measure a period of the selected synchronization signal, the corresponding numerical measure value for the given time functional parameter being based upon the period; and
at least one output terminal coupled to said measuring circuitry and configured to provide the corresponding numerical measure value without providing the corresponding result generated from the given memory operation.

9. The integrated circuit according to claim 8, wherein said time measurement circuitry comprises:
logic circuitry configured to provide a first counting signal to be asserted during a counting interval from the assertion of the start signal to the assertion of the stop signal; and
first counting circuitry configured to receive the first counting signal and a first reference synchronization signal, and determine the time difference by counting a number of cycles of the first reference synchronization signal within the first counting interval.

10. The integrated circuit according to claim 8 wherein the time functional parameters comprise one of band-gap time and a frequency of charge pumps.

11. A method for performing a parametric test on a non-volatile memory device integrated in a semiconductor chip, the method comprising:
receiving, a plurality of measure instructions for obtaining a plurality of numerical measure values for time functional parameters, each corresponding to one of a plurality of predefined memory operations of the memory device;
enabling, using processing circuitry integrated in the semiconductor chip, execution of a given one of the plurality of memory operation in response to a corresponding one of the plurality of measure instructions, the execution of the given memory operation generating a corresponding result;
providing, using control circuitry integrated in the semiconductor chip and cooperating with a memory integrated in the semiconductor chip, at least one time signal, different from the corresponding result, relating to the execution of each memory operation, the at least one time signal comprising a start signal to be asserted based upon starting of the execution of the given memory operation, a stop signal to be asserted based upon a stop of the execution of the memory operation, and a synchronization signal, the control circuitry being used to provide the at least one time signal by
selecting, using first selection circuitry, the start signal,
selecting, using further first selection circuitry, the stop signal,
measuring, using time measurement circuitry, a time difference between the assertion of the selected start signal and the assertion of the selected stop signal, the corresponding numerical measure value for the given time functional parameter based upon the time difference, selecting, using second selection circuitry, the synchronization signal, and measuring, using period measuring circuitry, a period of the selected synchronization signal, the corresponding numerical measure value for the given time functional parameter being based upon the period;

determining, using measuring circuitry integrated in the semiconductor chip, the corresponding numerical measure value for a given time functional parameter based upon to the at least one time signal; and providing the corresponding numerical measure value without providing the corresponding result generated from the given memory operation.

12. The method according to claim 11, wherein using the time measurement circuitry comprises:

providing, using logic circuitry, a first counting signal to be asserted during a counting interval from the assertion of the selected start signal to the assertion of the selected stop signal; and receiving, using first counting circuitry, the first counting signal and a first reference synchronization signal, and determine the time difference by counting a number of cycles of the first reference synchronization signal within the first counting interval.

13. The method according to claim 12, wherein using the logic circuitry comprises:

receiving, using a first logic inverter, the selected start signal and provide a corresponding negated selected start signal;

receiving, using a second logic inverter, the selected stop signal and provide a corresponding negated selected stop signal;

receiving, using other first selection circuitry, the selected start signal and the negated selected start signal and provide a functional start signal corresponding to a selected one between the selected start signal and the negated selected start signal according to the polarity of the selected start signal; and receiving, using further other first selection circuitry, the selected stop signal and the negated selected stop signal and provide a functional stop signal corresponding to a selected one between the selected stop signal and the negated selected stop signal according to the polarity of the selected stop signal; and receiving, using first logic circuitry, the functional start signal and the functional stop signal and provide the counting signal according to the functional start signal and the functional stop signal.

14. The method according to claim 11, wherein said period measuring circuitry comprises:

providing, second logic circuitry, a second counting signal, the second counting signal being asserted during a second counting interval between two consecutive assertions of the selected synchronization signal; and receiving, using further counting circuitry, the further counting signal and a second reference synchronization signal, and determining the period according to a counting of a number of cycles of the second reference synchronization signal within the second counting interval.

15. The method according to claim 14, wherein using the second logic circuitry comprises:

receiving, using scaling circuitry, the selected synchronization signal at an original frequency and provide a functional synchronization signal at a frequency scaled with respect to the original frequency by a scaling factor, the scaling factor being based upon a ratio between a frequency of the reference synchronization signal and an assumed value of the original frequency; and generating, using generating circuitry, the second counting signal based upon the functional synchronizing signal.

16. The method according to claim 15, wherein the first logic circuitry and the second logic circuitry comprise common logic circuitry configured to implement the first logic circuitry in a first configuration and the second logic circuitry in a second configuration; and wherein using the measuring circuitry comprises using registering circuitry to configure the common logic circuitry in at least one of the first configuration and the second configuration based upon the measure instruction, control the first selection circuitry and the further first selection circuitry in the first configuration and the second selection circuitry in the second configuration based upon the measure instruction, provide a polarity signal indicative of the polarity of the selected start signal and of the selected stop signal based upon the measure instruction in the first configuration, control the other first selection circuitry and the further other first selection circuitry based upon the polarity signal in the first configuration, and provide the scaling circuitry with a regulation signal indicative of the scaling factor in the second configuration.

17. The method according to claim 11 wherein the time functional parameters comprise one of band-gap time and a frequency of charge pumps.

* * * * *